(12) United States Patent
Serra et al.

(10) Patent No.: US 11,519,475 B2
(45) Date of Patent: Dec. 6, 2022

(54) VEHICLE BRAKE PAD AND A PRODUCTION PROCESS THEREOF

(71) Applicant: ITT Italia S.r.l., Barge (IT)

(72) Inventors: Stefano Serra, San Pietro Val Lemina (IT); Umberto Vignolo, Barge (IT); Marco Terranova, Turin (IT)

(73) Assignee: ITT ITALIA S.R.L., Barge (IT)

( * ) Notice: Subject to any disclaimer, the term of this patent is extended or adjusted under 35 U.S.C. 154(b) by 0 days.

(21) Appl. No.: 17/013,328

(22) Filed: Sep. 4, 2020

(65) Prior Publication Data

US 2021/0071728 A1 Mar. 11, 2021

(30) Foreign Application Priority Data

Sep. 6, 2019 (IT) .................. 102019000015839

(51) Int. Cl.
*F16D 66/00* (2006.01)
*F16D 65/092* (2006.01)
(Continued)

(52) U.S. Cl.
CPC .......... *F16D 66/00* (2013.01); *F16D 65/092* (2013.01); *G01L 1/16* (2013.01); *H05K 3/1216* (2013.01);
(Continued)

(58) Field of Classification Search
CPC .................. F16D 66/00; F16D 65/092; F16D 2250/0038; F16D 2250/0061;
(Continued)

(56) References Cited

U.S. PATENT DOCUMENTS 2,117,027 A 5/1938 Langbein
2,289,954 A 7/1942 Arndt
(Continued)

FOREIGN PATENT DOCUMENTS

CN 104813060 2/2018
CN 104821372 6/2018
(Continued)

OTHER PUBLICATIONS

Italian Search Report and Written Opinion for Application No. IT201900015839, dated Apr. 21, 2020 in 6 pages.
(Continued)

*Primary Examiner* — Pamela Rodriguez
(74) *Attorney, Agent, or Firm* — Knobbe, Martens, Olson & Bear, LLP

(57) ABSTRACT

Various systems, devices, and methods for a vehicle smart brake pad comprising a sensor such as a force sensing device, and a production process thereof. For example, a production process of a vehicle brake pad can include the following steps in time sequence: applying an electrical circuit a support plate; screen printing on the electrical circuit of at least a first electrode; screen printing on the at least first electrode of a sheet of piezoelectric material; screen printing on the sheet of at least a second electrode; applying a friction pad on the support plate; and bulk polarizing the sheet of piezoelectric material by a supply of power to the at least first and second electrodes.

18 Claims, 1 Drawing Sheet

(51) Int. Cl.
  *G01L 1/16* (2006.01)
  *H05K 3/12* (2006.01)
(52) U.S. Cl.
  CPC ............... *F16D 2066/005* (2013.01); *F16D 2200/0004* (2013.01); *F16D 2250/0038* (2013.01); *F16D 2250/0061* (2013.01)
(58) Field of Classification Search
  CPC ....... F16D 2066/005; F16D 2200/0004; G01L 1/16; H05K 3/1216
  See application file for complete search history.

(56) References Cited

U.S. PATENT DOCUMENTS

| | | | |
|---|---|---|---|
| 3,689,880 A | 9/1972 | McKee et al. | |
| 3,724,916 A | 4/1973 | Hirzel | |
| 3,902,157 A | 8/1975 | Kita et al. | |
| 4,023,864 A | 5/1977 | Lang et al. | |
| 4,117,451 A | 9/1978 | Sato et al. | |
| 4,298,857 A | 11/1981 | Robins et al. | |
| 4,456,098 A | 6/1984 | Lindre | |
| 4,484,280 A | 11/1984 | Brugger et al. | |
| 4,495,434 A | 1/1985 | Diepers et al. | |
| 4,602,702 A | 7/1986 | Ohta et al. | |
| 4,623,044 A | 11/1986 | Ohta et al. | |
| 4,649,370 A | 3/1987 | Thomason | |
| 4,782,319 A | 11/1988 | Dell'Acqua et al. | |
| 4,854,424 A | 8/1989 | Yamatoh et al. | |
| 4,869,350 A | 9/1989 | Fargier et al. | |
| 4,901,055 A | 2/1990 | Rosenberg et al. | |
| 4,928,030 A | 5/1990 | Culp | |
| 5,090,518 A | 2/1992 | Schenk et al. | |
| 5,099,962 A | 3/1992 | Furusu et al. | |
| 5,115,162 A | 5/1992 | Leonard et al. | |
| 5,133,431 A | 7/1992 | Braun | |
| 5,176,034 A | 1/1993 | Hazony et al. | |
| 5,235,135 A | 8/1993 | Knecht et al. | |
| 5,302,940 A | 4/1994 | Chen | |
| 5,325,011 A | 6/1994 | Kahn | |
| 5,404,067 A | 4/1995 | Stein | |
| 5,406,682 A | 4/1995 | Zimnicki et al. | |
| 5,416,415 A | 5/1995 | Dorri et al. | |
| 5,419,415 A | 5/1995 | Lamb et al. | |
| 5,719,577 A | 2/1998 | Pitot et al. | |
| 6,064,970 A | 5/2000 | McMillan et al. | |
| 6,179,091 B1 | 1/2001 | Takanashi | |
| 6,204,786 B1 | 3/2001 | Bieth et al. | |
| 6,247,560 B1 | 6/2001 | Bunker | |
| 6,310,545 B1 | 10/2001 | Sapir | |
| 6,339,956 B1 | 1/2002 | Huinink et al. | |
| 6,345,225 B1 | 2/2002 | Bohm et al. | |
| 6,414,818 B1 | 7/2002 | Tanimoto | |
| 6,477,893 B1 | 11/2002 | Djordjevic | |
| 6,529,803 B2 | 3/2003 | Meyers et al. | |
| 6,549,126 B2 | 4/2003 | Hageman et al. | |
| 6,612,736 B2 | 9/2003 | Lee et al. | |
| 6,668,983 B2 | 12/2003 | Drennen et al. | |
| 6,681,631 B2 | 1/2004 | Apel | |
| 6,813,581 B1 | 11/2004 | Snyder | |
| 6,823,242 B1 | 11/2004 | Ralph | |
| 6,934,618 B2 | 8/2005 | Eckert et al. | |
| 7,124,639 B1 | 10/2006 | Kurtz et al. | |
| 7,127,948 B2 | 10/2006 | Tavares et al. | |
| 7,331,427 B2 | 2/2008 | Mohr | |
| 7,451,653 B1 | 11/2008 | Sippola | |
| 7,694,555 B2 | 4/2010 | Howell et al. | |
| 8,026,802 B2 | 9/2011 | Shimura | |
| 8,287,055 B2 | 10/2012 | Lee | |
| 8,310,356 B2 | 11/2012 | Evans et al. | |
| 8,437,934 B2 | 5/2013 | Degenstein | |
| 8,717,158 B2 | 5/2014 | Roach | |
| 8,729,938 B2 | 5/2014 | Watanabe | |
| 8,789,896 B2 | 7/2014 | Albright et al. | |
| 8,958,966 B2 | 2/2015 | Nohira et al. | |
| 9,187,099 B2 | 11/2015 | Powers et al. | |
| 9,269,202 B2 | 2/2016 | Phelan et al. | |
| 9,316,278 B2 | 4/2016 | Moore et al. | |
| 9,353,815 B1 | 5/2016 | Eden | |
| 9,415,757 B2 | 8/2016 | Martinotto et al. | |
| 9,635,467 B2 | 4/2017 | Miyoshi et al. | |
| 9,827,961 B2 | 11/2017 | Spieker et al. | |
| 9,939,035 B2 | 4/2018 | Donzelli et al. | |
| 9,964,167 B2 | 5/2018 | Martinotto et al. | |
| 9,988,024 B2 | 6/2018 | Schwartz et al. | |
| 10,052,957 B2 | 8/2018 | Azzi | |
| 10,138,968 B2 | 11/2018 | Serra et al. | |
| 10,208,822 B2 | 2/2019 | Donzelli et al. | |
| 10,227,064 B2 | 3/2019 | Serra et al. | |
| 10,295,006 B2 | 5/2019 | Serra et al. | |
| 10,408,292 B2 | 9/2019 | Donzelli et al. | |
| 10,451,130 B2 | 10/2019 | Solari et al. | |
| 10,495,168 B2 | 12/2019 | Serra et al. | |
| 10,598,239 B2 | 3/2020 | Martinollo et al. | |
| 10,677,304 B2 | 6/2020 | Donzelli et al. | |
| 10,955,017 B2 | 3/2021 | Serra et al. | |
| 11,047,440 B2 | 6/2021 | Serra et al. | |
| 2001/0042661 A1 | 11/2001 | Reyde | |
| 2001/0049577 A1 | 12/2001 | Ruber | |
| 2002/0047496 A1 | 4/2002 | Wierach | |
| 2002/0095253 A1 | 7/2002 | Losey et al. | |
| 2002/0104717 A1 | 8/2002 | Borugian | |
| 2003/0111305 A1 | 6/2003 | Drennen et al. | |
| 2004/0015283 A1 | 1/2004 | Eckert et al. | |
| 2004/0041464 A1 | 3/2004 | Eckert et al. | |
| 2004/0187591 A1 | 9/2004 | Baumann et al. | |
| 2004/0238299 A1 | 12/2004 | Ralea et al. | |
| 2004/0242803 A1 | 12/2004 | Ohme et al. | |
| 2005/0029056 A1 | 2/2005 | Baumgartner et al. | |
| 2005/0103580 A1 | 5/2005 | Kramer | |
| 2005/0236104 A1 | 10/2005 | Tanaka | |
| 2005/0251306 A1 | 11/2005 | Gowan et al. | |
| 2006/0016055 A1* | 1/2006 | Wilkie | H01L 41/0993 29/25.35 |
| 2006/0076196 A1 | 4/2006 | Palladino | |
| 2006/0254868 A1 | 11/2006 | Thiesing et al. | |
| 2007/0024113 A1 | 2/2007 | Thrush | |
| 2007/0228824 A1 | 10/2007 | Yasukawa et al. | |
| 2007/0235268 A1 | 10/2007 | Caron | |
| 2007/0284713 A1 | 12/2007 | Ninomiya et al. | |
| 2008/0246335 A1 | 10/2008 | Spieker et al. | |
| 2009/0033146 A1 | 2/2009 | Rieth et al. | |
| 2009/0133971 A1 | 5/2009 | Baier-Welt | |
| 2009/0157358 A1 | 6/2009 | Kim | |
| 2009/0187324 A1 | 7/2009 | Lu et al. | |
| 2009/0218179 A1 | 9/2009 | Yokoyama et al. | |
| 2009/0223282 A1 | 9/2009 | Yamazaki | |
| 2009/0289529 A1 | 11/2009 | Ito | |
| 2010/0186938 A1 | 7/2010 | Murata et al. | |
| 2010/0210745 A1 | 8/2010 | McDaniel | |
| 2010/0211249 A1 | 8/2010 | McClellan | |
| 2010/0250081 A1 | 9/2010 | Kinser et al. | |
| 2011/0050406 A1 | 3/2011 | Hennig et al. | |
| 2011/0125381 A1 | 5/2011 | Szell et al. | |
| 2012/0055257 A1 | 3/2012 | Shaw-Klein | |
| 2013/0013348 A1 | 1/2013 | Ling et al. | |
| 2013/0018266 A1 | 1/2013 | Nishikubo | |
| 2013/0048443 A1 | 2/2013 | Muramatsu et al. | |
| 2013/0192933 A1 | 8/2013 | King et al. | |
| 2014/0097951 A1 | 4/2014 | Grgic | |
| 2014/0200784 A1 | 7/2014 | Nohira et al. | |
| 2014/0257605 A1 | 9/2014 | Beck et al. | |
| 2014/0311833 A1 | 10/2014 | Martinotto et al. | |
| 2014/0337086 A1 | 11/2014 | Asenjo et al. | |
| 2015/0112515 A1 | 4/2015 | Conway | |
| 2016/0014526 A1 | 1/2016 | Miyoshi et al. | |
| 2016/0084331 A1 | 3/2016 | Merlo et al. | |
| 2016/0146279 A1 | 5/2016 | Philpott | |
| 2016/0272176 A1 | 9/2016 | Furuyama | |
| 2016/0341622 A1 | 11/2016 | Mensa | |
| 2017/0052028 A1 | 2/2017 | Choudhury et al. | |
| 2017/0082163 A1 | 3/2017 | Serra et al. | |
| 2017/0082164 A1 | 3/2017 | Serra et al. | |
| 2017/0082165 A1 | 3/2017 | Donzelli et al. | |

(56) References Cited

U.S. PATENT DOCUMENTS

| | | |
|---|---|---|
| 2017/0082166 A1 | 3/2017 | Serra et al. |
| 2017/0082167 A1 | 3/2017 | Serra et al. |
| 2017/0267220 A1 | 9/2017 | Serra et al. |
| 2017/0331030 A1 | 11/2017 | Inoue et al. |
| 2018/0106319 A1 | 4/2018 | Solari et al. |
| 2018/0160248 A1 | 6/2018 | Murakami et al. |
| 2018/0244159 A1 | 8/2018 | Satterthwaite et al. |
| 2019/0003541 A1 | 1/2019 | Serra et al. |
| 2019/0005743 A1 | 1/2019 | Serra et al. |
| 2019/0078630 A1 | 3/2019 | Serra et al. |
| 2019/0241166 A1 | 8/2019 | Serra et al. |
| 2019/0249736 A1 | 8/2019 | Donzelli et al. |
| 2019/0338818 A1 | 11/2019 | Serra et al. |
| 2019/0351889 A1 | 11/2019 | Serra et al. |
| 2020/0088256 A1 | 3/2020 | Solari et al. |
| 2020/0124124 A1 | 4/2020 | Serra et al. |
| 2021/0148427 A1 | 5/2021 | Martinotto et al. |
| 2021/0348666 A1 | 11/2021 | Serra et al. |
| 2021/0388878 A1 | 12/2021 | Serra et al. |

FOREIGN PATENT DOCUMENTS

| | | |
|---|---|---|
| DE | 10006012 | 9/2000 |
| DE | 10230008 | 1/2004 |
| DE | 10243127 | 3/2004 |
| DE | 10259629 | 7/2004 |
| DE | 102005052630 | 3/2007 |
| DE | 102006018952 | 10/2007 |
| DE | 102006053489 | 5/2008 |
| DE | 102010010482 | 8/2011 |
| DE | 10-2012-007118 | 10/2013 |
| EP | 0189076 | 7/1986 |
| EP | 0601681 | 6/1995 |
| EP | 0744558 | 11/1996 |
| EP | 0781936 | 7/1997 |
| EP | 1431606 | 6/2004 |
| EP | 1530037 | 5/2005 |
| EP | 1531110 | 5/2005 |
| EP | 1923592 | 5/2008 |
| EP | 2741063 | 6/2014 |
| EP | 2778462 | 9/2014 |
| EP | 2570691 | 10/2014 |
| FR | 2815040 | 4/2002 |
| GB | 2309057 | 7/1997 |
| GB | 2372825 | 9/2002 |
| GB | 2478423 | 9/2011 |
| JP | S58-206458 | 12/1983 |
| JP | 04-054326 | 2/1992 |
| JP | H09-002240 | 1/1997 |
| JP | H1194707 | 4/1999 |
| JP | H11-125285 | 5/1999 |
| JP | 2002-130348 | 5/2002 |
| JP | 2002-538039 | 11/2002 |
| JP | 2003-205833 | 7/2003 |
| JP | 2006-193091 | 7/2006 |
| JP | 2007-224988 | 9/2007 |
| JP | 2011-116237 | 6/2011 |
| JP | 2012-202983 | 10/2012 |
| JP | 2016-516631 | 6/2016 |
| JP | 2016-521336 | 7/2016 |
| KR | 10-2007-0027041 | 3/2007 |
| KR | 2009-0057640 | 6/2009 |
| KR | 10-2004-48957 | 6/2010 |
| KR | 2011-0043849 | 4/2011 |
| KR | 10-2013-0039804 | 4/2013 |
| KR | 10-2015-0045047 | 4/2015 |
| KR | 10-2015-0143696 | 12/2019 |
| WO | WO 1999/08018 | 2/1999 |
| WO | WO 2004/027433 | 4/2004 |
| WO | WO 2014/170726 | 10/2014 |
| WO | WO 2014/170849 | 10/2014 |
| WO | WO 2015/013217 | 1/2015 |
| WO | WO 2016/038533 | 3/2016 |
| WO | WO 2016/189150 | 12/2016 |
| WO | WO2019/171289 | 9/2019 |

OTHER PUBLICATIONS

U.S. Appl. No. 16/020,680, filed Jun. 27, 2018, Donzelli et al.
European Search Report; European Application No. EP 14158449; dated Aug. 6, 2014.
International Search Report; International Application No. PCT/IB2013/060881; dated Jul. 3, 2014.
International Search Report; International Application No. PCT/IB2014/060778; dated Aug. 6, 2014.
International Search Report; International Application No. PCT/IB2015/056861; dated Jan. 18, 2016.
International Search Report in PCT Application No. PCT/EP2016/071865 dated Dec. 13, 2016 in 3 pages.
Chinese Office Action in Chinese Application No. 201680054121.1 dated Mar. 26, 2019 in 9 pages.
Chinese Office Action in Chinese Application No. 201680054121.1 dated Feb. 3, 2020 in 8 pages.
Chinese Office Action in Chinese Application No. 201680054121.1 dated Nov. 4, 2020 in 8 pages.
Chinese Office Action in Chinese Application No. 201680054121.1 dated Jan. 19, 2021 in 28 pages.
European Office Action in European Application No. 16770243.0 (Ref.B17603) dated Oct. 15, 2019 in 5 pages.
European Office Action in European Application No. 16770243.0 (Ref.B17603) dated Jan. 12, 2020 in 3 pages.
European Office Action in European Application No. 16770243.0 (Ref.B17603) dated Jun. 23, 2020 in 5 pages.
Indian Office Action Indian Application No. 201837009364 (PCC15904) dated Nov. 20, 2020 in 15 pages.
Official European Communication in European Application No. 16770243.0 dated Oct. 19, 2020 in 11 pages.
Written Opinion in PCT Application No. PCT/EP2016/071865 dated Dec. 13, 2020 in 6 pages.
Written Opinion in Japanese Application No. 2018513655 dated Oct. 12, 2020 in 4 pages.
Written Amendment in Japanese Application No. 2018513655 dated Oct. 12, 2020 in 5 pages.
Italian Search Report Coversheet for Italian Patent Application No. 102015000018714/ITUB20151184; dated Jan. 26, 2016; 1 page.
Italian Search Report Coversheet for Italian Patent Application No. 102015000018748/ITUB20151291; dated Feb. 3, 2016; 1 page.
Italian Search Report Coversheet Italian Patent Application No. 102015000018701 ITUB20151029; dated Feb. 3, 2016; 1 page.
Italian Search Report for Italian Patent Application No. 102015000018771 (UB20151059); dated Jan. 27, 2016; 1 page.
Italian Search Report for Italian Patent Application No. IO 56568 IT UB20151059; dated Jan. 20, 2016; 7 pages.
Italian Search Report for Italian Patent Application No. IO 56584/ITUB20151184; dated Jan. 14, 2016; 7 pages.
Italian Search Report for Italian Patent Application No. IO 56597/ITUB20151291; dated Jan. 25, 2016; 7 pages.
Italian Search Report Italian Patent Application No. Io 56565/ITUB20151029; dated Jan. 22, 2016; 8 pages.
Japanese Office Action in Japanese Application No. 2018513655 dated Jul. 14, 2020 in 16 pages.
Japanese Search Report in Japanese Application No. 2018513655 (0022000625) dated May 25, 2020 in 12 pages.
Von Wagner, et al., "Active Control of Brake Squeal Via 'Smart Pads'"; Oct. 10, 2004.
Solyom, Stefan, et al.; "Synthesis of a Model-Based Tire Slip Controller"; 2004; Vehicle System Dynamics, pp. 475-499; http://dx.doi.org/10.1080/004231105123313868.
Gustafsson, Fredrik; "Slip-based Tire-Road Friction Estimation"; Automatica, 1997; vol. 33, No. 6; pp. 1087-1099.
Pasillas-Lepine, William; "Hybrid Modeling and Limit Cycle Analysis for a Class of Five-Phase Anti-Lock Brake Algorithms"; Feb. 1, 2006; vol. 44, No. 2; pp. 173-188.
Capra, D. et al.; An ABS Control Logic Based on Wheel Force Measurement. In: Vehicle System Dynamics; vol. 50, No. 12, pp. 1779-1796; http://porto.polito.it/2497487/ date unknown.
Ait-Hammouda, Islam; "Jumps and Synchronization in Anti-Lock Brake Algorithms"; Oct. 2008, Japan, 7 pages; https://hal.archives-ouvertes.fr/hal-00525788.

(56) References Cited

OTHER PUBLICATIONS

Yi, Jingang; "Emergency Braking Control with an Observer-based Dynamic Tire/Rotation Friction Model and Wheel Angular Velocity Measurement"; Vehicle System Dynamics; 2003, vol. 39, No. 2; peg. 81-97.

Ray, Laura; "Nonlinear Tire Force Estimation and Road Friction Identification: Simulation and Experiments"; Automatica, vol. 33, No. 10, pp. 1819-1833; 1997.

Italian Search Report, IO 58761 (IT UB20153706), dated May 25, 2016, 8 pages.

Italian Search Report, IO 58837 (IT UB20153709), dated May 31, 2016, 7 pages.

International Search Report and Written Opinion; International Application No. PCT/EP2017/054455, filed on Feb. 27, 2017; dated May 3, 2017, 9 pages.

European Search Report and Opinion for EP Application No. 20193831.3, in 2 pages.

International Search Report and Written Opinion; International Application No. PCT/EP2017/059238; dated Aug. 10, 2017.

Chinese Office Action in Chinese Application No. 201980033093.9, dated Sep. 28, 2021, in 14 pages.

Chinese Office Action in Chinese Application No. 201980033093.9, dated Feb. 16, 2022, in 13 pages.

Second Office Action with English translation in Chinese Application No. 201780045954.6, in 14 pages.

Search Report with English translation in Japanese Application No. JP 2019-503519, dated Dec. 10, 2020, in 22 pages.

Office Action with English translation in Japanese Application No. 2019-503519, dated Dec. 23, 2020, in 20 pages.

First Office Action with English translation in Chinese Application No. 201780045954.6, in 15 pages.

Japanese Written Amendment in Japanese Application No. 2018545192, dated Feb. 24, 2021, in 8 pages.

International Search Report and Written Opinion for Application No. PCT/EP2019/062680, dated Jun. 27, 2019, in 9 pages.

Italian Search Report for Italian Application No. IT 201800005484, dated Feb. 19, 2019, in 7 pages.

Japanese Office Action in Japanese Application No. 2018-545192, dated Jan. 5, 2021, in 17 pages.

\* cited by examiner

VEHICLE BRAKE PAD AND A PRODUCTION PROCESS THEREOF

INCORPORATION BY REFERENCE OF ANY PRIORITY APPLICATIONS

All applications for which a foreign or domestic priority claim is identified in the Application Data Sheet as filed with the present application are hereby incorporated by reference under 37 CFR 1.57.

BACKGROUND

The following disclosure relates to a vehicle smart brake pad comprising a sensor such as a force sensing device, and a production process thereof.

SUMMARY OF CERTAIN EMBODIMENTS

Piezoelectricity is the electric charge that accumulates inside a particular type of solid materials in response to external applied mechanical stress.

Piezoelectric materials include nanocrystals of quartz, tourmaline and Rochelle salt, but they show a relatively small piezoelectric response to external solicitations. To overcome this problem some polycrystalline ferroelectric ceramics are synthesized such as barium titanate (BaTiO3) and lead zirconate titanate (PZT) that exhibit larger displacements or induce larger electric voltages after mechanical stress is applied.

A polarization procedure can be employed to these synthetized piezoelectric materials. For this purpose, a strong electric field of several kV/mm can be applied to create an asymmetry in the previously unorganized ceramic compound.

The electric field causes a reorientation of the spontaneous polarization and at the same time, domains with a favorable orientation to the polarity field direction grow and those with an unfavorable orientation are suppressed. After polarization, most of the reorientations are preserved even without the application of an electric field.

While piezoceramic compounds can be produced in several different ways, the most common manufacturing technique is based on the mechanical hydraulic pressing of spray-dried granular material. After the production the compound is sintered at temperatures of up to approx. 1300° C. The result is a solid ceramic of high density. Later the piezoelectric material is polarized as said before and then the sintered ceramic (that is very hard) can be sawn and machined. The compacts come in different shapes as disks, plates, rods, and cylinders.

The last phase of manufacturing process can include deposition of electrodes. Electrodes can be applied to the piezoceramic by screen printing technology or physical vapor deposition (PVD) (sputtering) and subsequently baked at temperatures above 800° C.

Limits of the current production technologies for sensing devices based on piezoelectrical materials lie on the different mechanical steps of the production of the piezoelectric material and subsequent machining to the desired shapes and sizes, and the then final coupling with the electrodes.

Accordingly, such standard sensing devices based on piezoelectrical materials are expensive and require a long production process.

The present disclosure provides certain embodiments that overcome these and other problems.

Screen-printing technology is a fast and low-cost process. Where a piezo element is screen printed, which is a normal force sensor according to an example, it can allow a robust design and a cost reduction in an industrial process of a sensorized object, for instance a smart brake pad for vehicles.

Compared to the technology currently on the market for piezoelectric sensors, the screen-printed one can reduce the production steps since the sensor itself can be produced directly on the object to be sensorized, and it can also be polarized "in situ".

Therefore, according to certain embodiments it is not necessary to produce the sensor polarized and then install it on the object but it would instead directly be integrated in the same.

Screen-printing technique is widely used in printed electronics and is one of the most promising technologies to manufacture a wide range of electronic devices. Some advantages of screen-printed sensors include sensitivity, selectivity, possibility of mass-production and miniaturization.

This technology can include depositing successive layers of special inks or pastes onto an insulating substrate.

The pastes can be based on a polymeric binder with metallic dispersions or graphite, and can also contain functional materials such as cofactors, stabilizers and mediators.

An advantage of screen-printed technology resides in the possibility that the manufacture can be performed in a single step including all the phases of the device fabrication, from electrode to material deposition.

Furthermore, the present disclosure can provide for a simplified procedure for the in-situ polarization of the fabricated device, as a normal force sensor.

The devices fabricated using this type of technology are typically very thin (h=10÷100 μm) and may not be limited to particular geometry or planar extension.

By taking advantage of these geometrical properties it can be possible to define some electrodes configuration to control the field direction, with the aim of obtaining preferential polarization directions.

According to certain embodiments, a smart brake pad is a sensorized brake pad configured (e.g., with appropriate software and hardware system architecture and some algorithms) to measure one or more parameters, such as the brake pad temperature and/or static and dynamic quantities including normal and shear forces applied during braking.

Certain embodiments described in the present disclosure obviate limitations of current production technologies.

Certain embodiments according to the present disclosure provide a vehicle brake pad comprising: a support plate; a friction pad; at least a force sensing device; and an electrical circuit configured to collect signals from said at least a force sensing device, said force sensing device comprising: a sheet of piezoelectric material having a first and a second main faces parallel to each other; at least a first electrode located on said first main face; and at least a second electrode located on said second main face; wherein said sheet of piezoelectric material, said first and second electrodes are made each of a screen-printed layer.

In an embodiment said force sensing device is a normal force sensing device. In an embodiment said force sensing device is a shear force sensing device. In an embodiment said at least a first electrode and at least said second electrode are digitated.

Certain embodiments provide a production process of a vehicle brake pad comprising the following steps, which may be performed in time sequence: applying an electrical circuit on a support plate; screen printing on said electrical circuit of at least a first electrode; screen printing on said at least first electrode of a sheet of piezoelectric material; screen printing on said sheet of at least a second electrode; applying a friction pad on said support plate; and bulk polarizing said sheet of piezoelectric material by a supply of power to said at least first and second electrodes.

According to such a process, bulk polarization of the piezoelectric material can be made in situ, on the screen-printed sensing device already integrated in the item to be monitored.

BRIEF DESCRIPTION OF THE DRAWINGS

Additional features and benefits of the invention will become further evident from the description below. These and other features are illustrated by way of certain non-limiting examples in the accompanying drawings, in which.

DETAILED DESCRIPTION OF CERTAIN EMBODIMENTS

Figure 1:
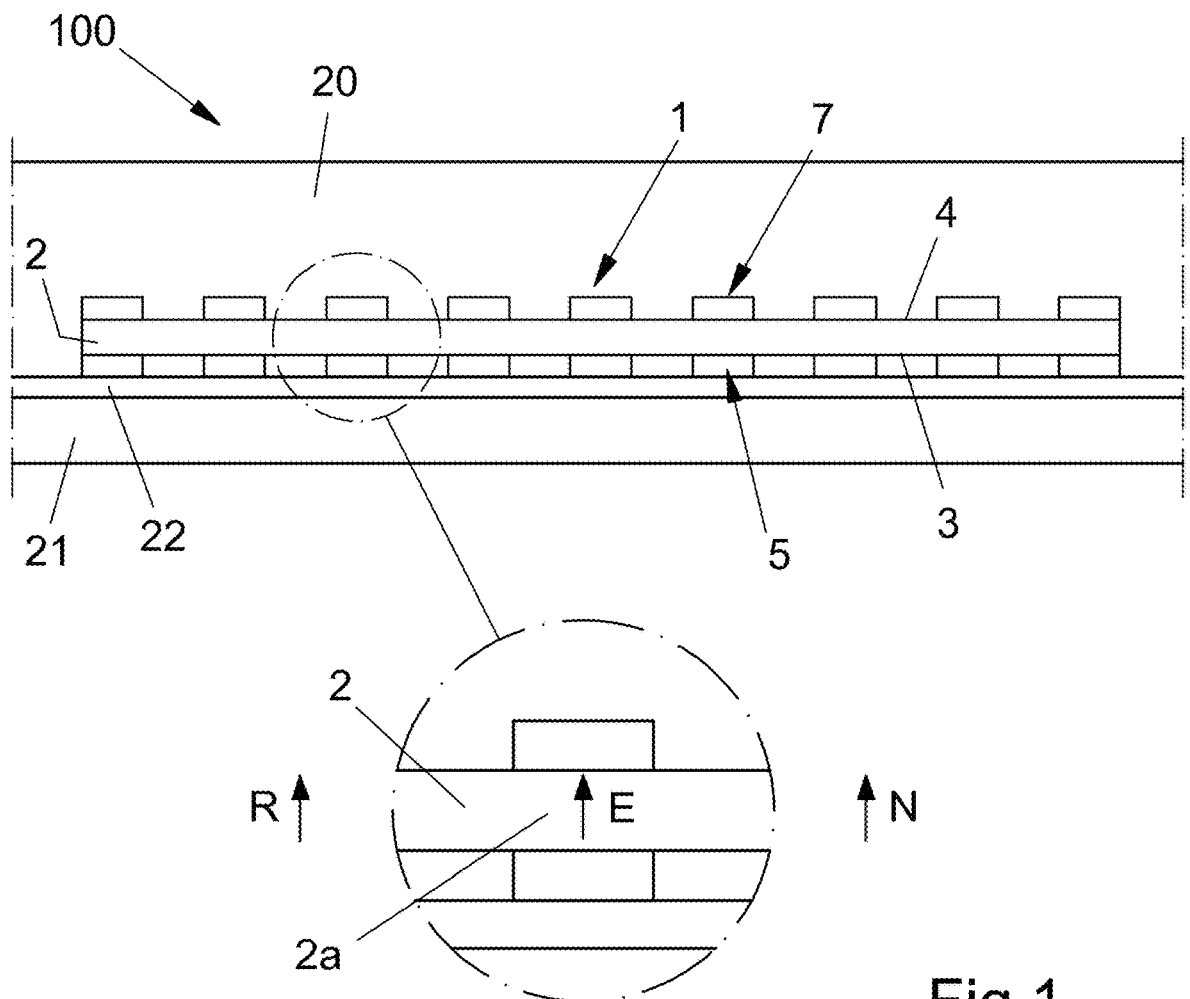
FIG. 1 schematically shows a vertical cross section of a portion of an embodiment of a vehicle brake pad where the electric field during the polarization phase is represented.

Embodiments of systems, components, and methods will now be described with reference to the accompanying figures, wherein like numerals refer to like or similar elements throughout. Although several embodiments, examples and illustrations are disclosed below, the inventions described herein extends beyond the specifically disclosed embodiments, examples, and illustrations. The inventions disclosed herein can include other uses of the inventions and obvious modifications and equivalents thereof. The terminology used in the description presented herein is not intended to be interpreted in any limited or restrictive manner simply because it is being used in conjunction with a detailed description of certain specific embodiments of the inventions. Embodiments of the inventions can comprise several novel features. No single feature is solely responsible for its desirable attributes or is essential to practicing the inventions herein described.

Various design embodiments are possible, and the ones depicted in the accompanying drawings are for illustrative purposes and should in no way be interpreted as limiting the scope of this disclosure.

Various features of different disclosed embodiments can be combined to form additional embodiments, which are part of this disclosure.

The following detailed description, reference is made to the accompanying drawings, which form a part hereof. In the drawings, similar reference numbers typically identify similar components, unless context dictates otherwise. The illustrative embodiments described in the detailed description and drawings are not meant to be limiting.

Other embodiments may be utilized, and other changes may be made, without departing from the spirit or scope of the subject matter presented here.

The aspects of the present disclosure, as generally described herein, and illustrated in the figures, may be arranged, substituted, combined, and designed in a wide variety of different configurations, all of which are explicitly contemplated and made a part of this disclosure.

Figure 2:
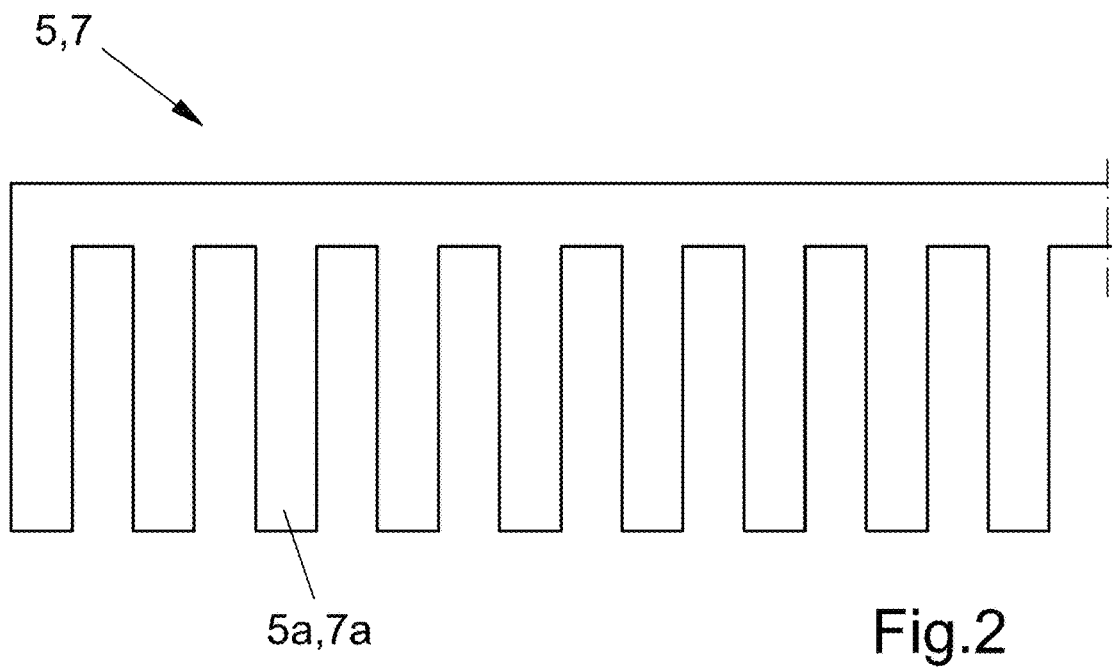
FIG. 2 schematically shows a digitated electrode of the force sensor of the vehicle brake pad of FIG. 1.

Reference is made now to FIGS. 1 and 2. A normal force sensing device 1 comprises a sheet 2 of piezoelectric material having a first main face 3 and a second main face 4 parallel to each other, and orthogonal to them is identified a normal stress direction N.

On the first main face 3 of the sheet 2 of piezoelectric material at least a first digitated electrode 5 is located having at least one, preferably more digits 5a. On the second main face 4 of the sheet 2 of piezoelectric material at least a second digitated electrode 7 is located having at least one, preferably more digits 7a. The first and second electrodes 5 and 7 have digits 5a and 7a aligned to each other along a reading direction R accordingly to the normal force direction N. The piezoelectric material of the sheet 2 has a bulk electric polarization with vector field E normally oriented in the reading direction R. Advantageously each pair of aligned digits 5a, 7a of the first and second reading electrodes 5 and 7 enclose a respective zone 2a of the piezoelectric material of the sheet 2 having the vector E normally oriented in the normal force direction N.

In the illustrated embodiment, the sheet 2 of piezoelectric material is made of a screen-printed layer. In the illustrated embodiment, each electrode 5, 7 is made of a screen-printed layer as well.

Digits 5a, 7a of the first and second electrodes 5 and 7 are preferably stripes having a same length and a same width. To maximize the advantage of the new technology, different embodiments of electrodes geometries are possible.

The three layers of lower electrode 5, piezo material 2, and upper electrode 7, are screen printed in sequence, from the lowest to the topmost.

Different areas will be defined inside the bulk of the piezoelectric material 2: active regions 2a are that zones where the signal will be collected. During the polarization phase, the electrodes 5 and 7 are powered, creating a normal electric field E in the piezo material 2.

During the reading phase, the electrodes 5 and 7 are used to collect the signal produced by the deformation of the piezo material 2.

According to certain embodiments, the force sensing device 1 is integrated into a vehicle braking pad device 100 and polarized "in situ".

The braking pad device comprises a brake or braking pad 100 comprising a support plate 21, a friction pad 20, and an electrical circuit 22 equipped with the force sensor 1 and other sensors not shown for real-time detection of signals relating at least to forces (shear and normal forces) and preferably also to temperatures. The braking pad 100 can comprise at least one normal force sensor and/or at least a shear sensor according to present disclosure 1.

The temperature sensors can be thermistors, for example PT1000, PT200 or PT100.

The electrical circuit 22 has electrical terminals arranged in a zone for collecting the signals from said braking pad 100.

The support plate 21, preferably but not necessarily made of a metal, directly supports the electrical circuit 22. The friction pad 20 is applied on the side of the support plate 21 where the electrical circuit 22 is present, the electrical circuit 22 is thus incorporated between the support plate 21 and the friction pad 20. A damping layer can be included, which coats the electrical circuit 22 and is interposed between the friction pad 20 and the support plate 21.

In some embodiments, the brake pad is provided with sensors (Piezoceramic, Piezoelectric, Capacitive, Piezoresistive, Strain Gauges or other force or deformation sensors) and it is composed mostly by four different parts: backplate (metallic support), a sensing layer on the backplate (Electronic Circuit, interconnection media and integrated force and temperature sensors), a damping layer (or Underlayer UL, as optional layer) and a Friction material layer (friction material FM).

The smart braking device may include a limited number of sensors in order to limit the number of operations and the power budget of electronics to be suitable for a wireless system for an on-board application.

During use, the brake pad can be capable of transmitting an electrical signal which is proportional to the braking forces applied to said braking element as a result of coming into contact with the element being braked, a braking element that is both easy to be constructed and easily usable.

The force sensor may have, preferably, at least 0.2 mm of thickness and made of piezoceramic material with operating temperature higher than 200° C. The force sensor allows for measurement of the actual force applied by the vehicle system to the braking pad.

The electrical circuit 22 on which the sensors are installed is properly electrically insulated. The electrical circuit 22 has appropriately shaped branches to arrange the sensors in discrete positions on the support plate 21. The electrical circuit 22 can be a screen-printed circuit.

The smart pad 100, as mentioned, can be provided with appropriate sensors able in working conditions to transmit electrical signals proportional to forces applied to the braking element due to the contact with the element subject to braking.

The braking device is applied to the brake caliper of a wheel of a vehicle. In particular, at least a braking device is included for each braking caliper, and therefore for example a total of at least four braking devices are on-board the vehicle.

Although the embodiment shown relates to a brake pad having at least a normal force sensor screen printed and polarized in situ and a production process thereof, another embodiment not shown encompasses a brake pad having at least a shear force sensor screen printed and polarized in situ and a production process thereof. In both cases of normal force sensor and shear force sensor, the production process includes in time sequence following steps: applying the electrical circuit on the support plate; screen printing on the electrical circuit of the at least a first electrode; screen printing on the at least a first electrode of the sheet of piezoelectric material; screen printing on the sheet of piezoelectric material of the at least a second electrode; applying the friction pad on the support plate; and bulk polarizing the sheet of piezoelectric material by a supply of power to the at least first and second electrodes.

The force sensing device and production process thereof thus conceived are susceptible of numerous modifications and variants, all falling within the scope of the inventive concept; moreover, all the details as well as the dimensions may be replaced with other technically equivalent ones, according to need and the state of the art.

Certain Terminology

Terms of orientation used herein, such as "top," "bottom," "horizontal," "vertical," "longitudinal," "lateral," and "end" are used in the context of the illustrated embodiment. However, the present disclosure should not be limited to the illustrated orientation. Indeed, other orientations are possible and are within the scope of this disclosure. Terms relating to circular shapes as used herein, such as diameter or radius, should be understood not to require perfect circular structures, but rather should be applied to any suitable structure with a cross-sectional region that can be measured from side-to-side. Terms relating to shapes generally, such as "circular" or "cylindrical" or "semi-circular" or "semi-cylindrical" or any related or similar terms, are not required to conform strictly to the mathematical definitions of circles or cylinders or other structures, but can encompass structures that are reasonably close approximations.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language, such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

The terms "approximately," "about," and "substantially" as used herein represent an amount close to the stated amount that still performs a desired function or achieves a desired result. For example, in some embodiments, as the context may permit, the terms "approximately", "about", and "substantially" may refer to an amount that is within less than or equal to 10% of the stated amount. The term "generally" as used herein represents a value, amount, or characteristic that predominantly includes or tends toward a particular value, amount, or characteristic. As an example, in certain embodiments, as the context may permit, the term "generally parallel" can refer to something that departs from exactly parallel by less than or equal to 20 degrees.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a device configured to carry out recitations A, B, and C" can include a first device configured to carry out recitation A working in conjunction with a second device configured to carry out recitations B and C.

The terms "comprising," "including," "having," and the like are synonymous and are used inclusively, in an open-ended fashion, and do not exclude additional elements, features, acts, operations, and so forth. Likewise, the terms "some," "certain," and the like are synonymous and are used in an open-ended fashion. Also, the term "or" is used in its inclusive sense (and not in its exclusive sense) so that when used, for example, to connect a list of elements, the term "or" means one, some, or all of the elements in the list.

Overall, the language of the claims is to be interpreted broadly based on the language employed in the claims. The language of the claims is not to be limited to the non-exclusive embodiments and examples that are illustrated and described in this disclosure, or that are discussed during the prosecution of the application.

Summary

Various systems, devices, and methods have been disclosed in the context of certain embodiments and examples above. However, this disclosure extends beyond the specifically disclosed embodiments to other alternative embodiments and/or uses and obvious modifications and equivalents thereof. In particular, while the systems, devices, and methods has been described in the context of illustrative embodiments, certain advantages, features, and aspects of the devices, systems, and methods may be realized in a variety of other applications. Various features and aspects of the disclosed embodiments can be combined with or substituted for one another in order to form varying modes of the devices, systems, and methods. The scope of this disclosure should not be limited by the particular disclosed embodiments described herein.

The systems, devices, and methods described above are susceptible to numerous modifications and variations, all falling within the scope of the inventive concept; moreover all of the components can be replaced by technically equivalent elements. Additionally, various aspects and features of the embodiments described can be practiced separately, combined together, or substituted for one another. A variety of combination and subcombinations of the disclosed features and aspects can be made and still fall within the scope of this disclosure. Certain features that are described in this disclosure in the context of separate implementations can also be implemented in combination in a single implementation. Conversely, various features that are described in the context of a single implementation can also be implemented in multiple implementations separately or in any suitable subcombination. Although features may be described above as acting in certain combinations, one or more features from a claimed combination can, in some cases, be excised from the combination, and the combination may be claimed as any subcombination or variation of any sub combination.

Moreover, while operations may be depicted in the drawings or described the specification in a particular order, such operations need not be performed in the particular order shown or in sequential order, and all operations need not be performed, to achieve the desirable results. Other operations that are not depicted or described can be incorporated in the example methods and processes. For example, one or more additional operations can be performed before, after, simultaneously, or between any of the described operations. Further, the operations may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Some embodiments have been described in connection with the accompanying drawings. The figures are drawn to scale, but such scale should not be limiting, since dimensions and proportions other than what are shown are contemplated and are within the scope of this disclosure. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, any methods described herein may be practiced using any device suitable for performing the recited steps.

In summary, various embodiments and examples of systems, devices, and methods have been disclosed. Although the systems and methods have been disclosed in the context of those embodiments and examples, this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Thus, the scope of this disclosure should not be limited by the particular embodiments described above, but should be determined only by a fair reading of the claims that follow.

What is claimed is:

1. A vehicle brake pad comprising:
   support plate;
   a friction pad;
   at least a force sensing device; and
   an electrical circuit configured to collect signals from said at least a force sensing device, said force sensing device comprising:
      a sheet of piezoelectric material having first and second main faces parallel to each other;
      at least a first electrode located on said first main face; and
      at least a second electrode located on said second main face;
      wherein said sheet of piezoelectric material, said first and second electrodes are made each of a screen-printed layer,
      wherein the first electrode, the second electrode, and the sheet of piezoelectric material form the force sensing device, and
      wherein the sheet of piezoelectric material is configured for bulk polarization by supplying power to the first and second electrodes in-situ, the force sensing device integrated into the vehicle brake pad.

2. A vehicle brake pad according to claim 1, wherein said force sensing device is a normal force sensing device.

3. A vehicle brake pad according to claim 1, wherein said force sensing device is a shear force sensing device.

4. A vehicle brake pad according to claim 3, wherein said at least a first electrode and said at least a second electrode are digitated.

5. A vehicle brake pad according to claim 1, wherein the at least a first electrode comprises a plurality of digits and the at least a second electrode comprises a plurality of digits.

6. A vehicle brake pad according to claim 5, wherein the plurality of digits of the at least a first electrode are aligned with the plurality of digits of the at least a second electrode in a reading direction of the at least a force sensing device.

7. A vehicle brake pad according to claim 5, wherein the plurality of digits of the at least a first electrode are aligned with the plurality of digits of the at least a second electrode in a normal force direction of the at least a force sensing device.

8. A vehicle brake pad according to claim 5, wherein the plurality of digits of the at least a first electrode and of the at least a second electrode are parallel to the first and second main faces of the sheet of piezoelectric material.

9. A vehicle brake pad according to claim 1, wherein regions of the sheet of piezoelectric material between the first and second electrodes are polarized with a vector field oriented in a reading direction of the at least a force sensing device.

10. A method of making a vehicle brake pad, the method comprising:
    applying an electrical circuit on a support plate;
    screen printing on said electrical circuit at least a first electrode;
    screen printing on said at least a first electrode a sheet of piezoelectric material;
    screen printing on said sheet at least a second electrode;

applying a friction pad on said support plate; and bulk polarizing said sheet of piezoelectric material by a supply of power to said at least first and second electrodes, wherein the first electrode, the second electrode, and the sheet of piezoelectric material form at least one force sensing device, and wherein said bulk polarizing is done in-situ with the at least one force sensing device integrated into the vehicle brake pad.

11. A method according to claim 10, wherein the at least one force sensing device is a normal force sensing device.

12. A method according to claim 10, wherein the at least one force sensing device is a shear force sensing device.

13. A method according to claim 10, wherein the at least a first electrode and the at least a second electrode are digitated.

14. A method according to claim 10, wherein the at least a first electrode comprises a plurality of digits and the at least a second electrode comprises a plurality of digits.

15. A method according to claim 14, wherein the plurality of digits of the at least a first electrode are aligned with the plurality of digits of the at least a second electrode in a reading direction of the at least one force sensing device.

16. A method according to claim 14, wherein the plurality of digits of the at least a first electrode are aligned with the plurality of digits of the at least a second electrode in a normal force direction of the at least one force sensing device.

17. A method according to claim 14, wherein the plurality of digits of the at least a first electrode and of the at least a second electrode are parallel to the first and second main faces of the sheet of piezoelectric material.

18. A method according to claim 10, wherein regions of the sheet of piezoelectric material between the first and second electrodes are polarized with a vector field oriented in a reading direction of the at least one force sensing device.

* * * * *